(12) United States Patent
Mirkarimi et al.

(10) Patent No.: US 7,196,017 B2
(45) Date of Patent: Mar. 27, 2007

(54) METHOD FOR ETCHING SMOOTH SIDEWALLS IN III-V BASED COMPOUNDS FOR ELECTRO-OPTICAL DEVICES

(75) Inventors: Laura Wills Mirkarimi, Sun I., CA (US); Kai Cheung Chow, San Jose, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 164 days.

(21) Appl. No.: 10/692,772

(22) Filed: Oct. 24, 2003

(65) Prior Publication Data

US 2005/0090116 A1 Apr. 28, 2005

(51) Int. Cl.
*H01L 21/302* (2006.01)

(52) U.S. Cl. .................. 438/714; 438/706; 438/718; 216/67

(58) Field of Classification Search ................ 438/706, 438/710, 711, 712, 718; 216/58, 67
See application file for complete search history.

(56) References Cited

U.S. PATENT DOCUMENTS

| | | | |
|---|---|---|---|
| 5,338,394 A | | 8/1994 | Fathimulla et al. |
| 5,624,529 A | * | 4/1997 | Shul et al. .................. 438/718 |
| 6,034,344 A | * | 3/2000 | Ittleson et al. ............ 219/76.14 |
| 6,261,962 B1 | * | 7/2001 | Bhardwaj et al. ........... 438/702 |
| 6,635,185 B2 | * | 10/2003 | Demmin et al. .............. 216/64 |
| 6,893,971 B2 | * | 5/2005 | Tanabe et al. .............. 438/706 |
| 2003/0066817 A1 | | 4/2003 | Tanabe et al. |

OTHER PUBLICATIONS

Grover, Rohit, "Process Development of Methane-Hydrogen-Argon-Based Deep Dry Etching of InP High Aspect-Ratio Structures with Vertical Facet-Quality Sidewalls", Journal of Vacuum Science Technology, B 19(5), Sep./Oct. 2001, pp. 1694-1698.
Chen, Hsin-Yi et al., "Inductively Coupled Plasma Etching of InP using Ch4/H2 and CH4/H2/N2", Jounral of Vacuum Science Technology, B 20(1), Jan./Feb. 2002, pp. 47-52.
Hur, Katerina Y., et al., "Reacitve Ion Etching of InP Via Holes", Jounral of Vacuum Science Technology, B 12(3), May/Jun. 1994, pp. 1410-1412.
Feupier, Y. et al., Influence of the Gas Mixture on the Reactive Ion Etching of InP in CH4-H2 Plasmas, Jounral of Vacuum Science Technology, B 15(5), Sep./Oct. 1997, pp. 1733-1740.
Kim DW, et al—"A Study of GaN Etching Characteristics Using HBr-Based Inductively Coupled Plasmas" Solid State Electronics, Elsevier Science Publishers, Barking, GB.
Pearton SJ, et al—"Dry Etching Characteristics of III-V Semiconductors in Microwave BCL3 Discharges" Plasma Chemistry and Plasma Processing, Plenum Press. New York, US—vol. 13, No. 2, Jun. 1, 1993.
Lee. et al—"Reactive Ion Etching of Vertical GaN Mesas by the Addition of C114 to BC13/H2/Ar Inductively Coupled Plasma"—Semiconductor Science and Technology , 10P, Bristol, GB. vol. 16. No. 6, Jun. 2001.
Langer JP, et al—"Electron Cyclotron Resonance Plasma Etching of GaSb in C12/BC13/Ch4/Ar/H2 at Room Temperature" Journal of Vacuum Science & Technology B: Microelectronics Processing and Phenomena, American Vacuum Society, New York, NY, US—vol. 21, No. 4, Jul. 2003.

* cited by examiner

*Primary Examiner*—Lan Vinh

(57) ABSTRACT

III-V based compounds are etched to produce smooth sidewalls for electro-optical applications using $BCl_3$ together with chemistries of $CH_4$ and $H_2$ in RIE and/or ICP systems. HI or IBr or some combination of group VII gaseous species (Br, F, I) may be added in accordance with the invention.

16 Claims, 4 Drawing Sheets

METHOD FOR ETCHING SMOOTH SIDEWALLS IN III-V BASED COMPOUNDS FOR ELECTRO-OPTICAL DEVICES

BACKGROUND

The etching of smooth sidewalls in III-V compounds is important for optical applications. Scattering loss in electro-optical devices is proportional to sidewall roughness. Hence, the performance of devices such as waveguides, microdisc resonators, photonic crystal waveguides and photonic crystal resonators depends on reduction of the sidewall roughness. Single mode ridge waveguides in InP and GaAs typically require dimensions on the order of 0.5 µm to maintain single mode performance as scattering losses from the waveguide surface are a large component of the propagation loss. Most work on etching III-V compounds such as InP for low loss waveguides has focused on $CH_4:H_2$ chemistry in standard reactive ion etch (RIE) systems. A feature of sidewalls produced in standard RIE systems is that the sidewalls are sloped. Some electro-optical devices require highly vertical sidewall geometries for improved device performance. For example, in photonic crystal lattices, it is important to provide highly vertical sidewall geometries to enable large photonic bandgaps for device performance.

Hence, it is desirable to have etch chemistries that enable highly vertical sidewall geometries with smooth sidewalls.

Inductively coupled plasma (ICP) etch systems typically produce a higher degree of vertical etches for most materials due to the increase in density of active species. However the chemistry selection still plays an important role in obtaining high aspect ratio etching. Typically, a $CH_4:H_2$ based chemistry is used for etching InP; however, $CH_4:H_2$ based chemistry has difficulty etching very high apect ratios. Using chlorine based chemistry is problematic for obtaining high aspect ratio etching due to the highly reactive nature of chlorine. Recent work by Mirkarimi (see Ser. No. 10/765, 647) has shown the usefulness of using $HBr:CH_4:H_2$ chemistry to achieve deep etching in III-V compounds. However, the sidewalls of the etched III-V structure in some quaternary compositions such as InGaAsP exhibit rough sidewalls when using $Hbr:CH_4:H_2$ chemistry.

SUMMARY OF INVENTION $BCl_3$ additions chemistry is used to provide high aspect ratio etching together with smooth sidewalls. The $BCl_3$ additions improve the smoothness of the etched sidewalls and other surfaces. Optical losses on narrow waveguides have been typically reduced by a factor of 10 through the $BCl_3$ additions and typical etch rates of 370 nm/min can be achieved compared to etch rates of 35 nm/min using standard $CH_4:H_2$ based chemistry.

DETAILED DESCRIPTION OF THE INVENTION

Figure 1A:
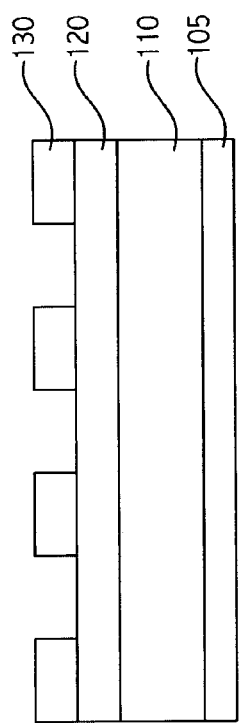
FIGS. 1a–1c show steps for etching smooth high aspect sidewalls in accordance with the invention.
Figure 1B:
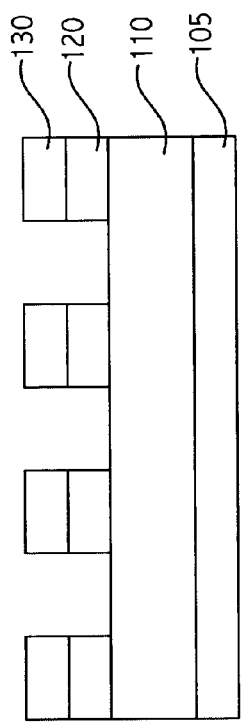
Figure 1C:
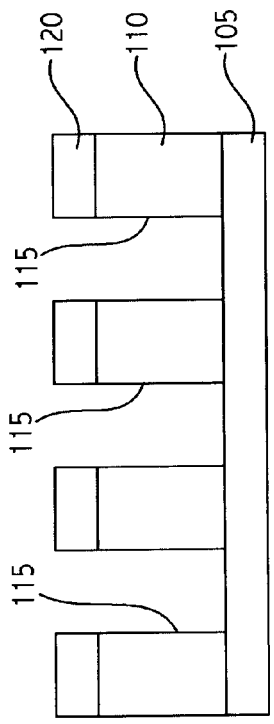

In accordance with an embodiment of the invention, appropriate mask layer 120 (see FIG. 1a), typically $SiO_2$ or $Si_3N_4$ is grown onto III-V epitaxial layer 110 or onto III-V substrate 105 of sample 100. Layer 130 is either photoresist or e-beam resist. Typical III-V materials are those that are combinations of Group III elements such as Al, Ga, In and B and Group V elements such as N, P, As and Sb. In accordance with the invention, the use of $SiO_2$ or $Si_3N_4$ mask 120 or other similar mask material offers etch selectivity between the mask material and the III-V material. The etch rate ratio of $InP/SiO_2$ ranges from 20–50 depending on the etch conditions which is quite large. Chlorine $Cl_2$ based chemistries do not afford these types of etch ratios. In FIG. 1b, mask layer 120 is defined by lithographic techniques such as direct write electron beam, standard contact lithography or other lithography appropriate for the desired feature size typically on the order of 1 µm on layer 130. Typically, the desired etch pattern is transferred into mask layer 120 using a dry etch technique such as $CHF_3$ in an RIE system. Sample 100 is then etched using either an RIE or inductively coupled plasma (ICP) system yielding a high aspect ratio structure with smooth sidewalls 115. In FIG. 1c, photoresist layer 130 is removed using a solvent bath followed by a high pressure (400 mTorr) O2 plasma clean.

In accordance with an embodiment of the invention, chemistries involving $CH_4$, $H_2$, HBr and $BCl_3$ are then used to transfer the lithographically defined features into III-V layer 110 or III-V substrate 105. The chemistries involving $CH_4$, $H_2$, HBr and $BCl_3$ provide the desired smooth etch by forming a passivation layer on sidewalls 150. The smoothness of sidewalls 150 in FIG. 1 may be estimated from scanning electron microscopy which then influences the propagation loss measurements. Note that in accordance with the invention HI or IBr or some combination of group VII gaseous species (Br, F, I) may be substituted for HBr. The iodine (I) will typically behave similarly with the bromine (Br) and form a lower volatility salt with indium (In) compared to, for example, chlorine (Cl) and again form a passivation layer on sidewalls 150. Additionally in accordance with the invention, $BCl_3$ may be used with $H_2$ and $CH_4$ such that the ratio of $CH_4$ to $H_2$ is greater than 1:1, for example 2:1, respectively.

In accordance with the invention, the etch chemistry is typically a combination of $HBr:CH_4:H_2:BCl_3$. In typical embodiments in accordance with the invention, the ratio of $HBr:CH_4:H_2$ is set to about 30:5:5 while $BCl_3$ may be adjusted up to about 50% by volume. Using ICP instead of RIE typically enhances the smoothness although, typically, significant reductions of surface roughness are achievable using RIE alone.

Figure 2:
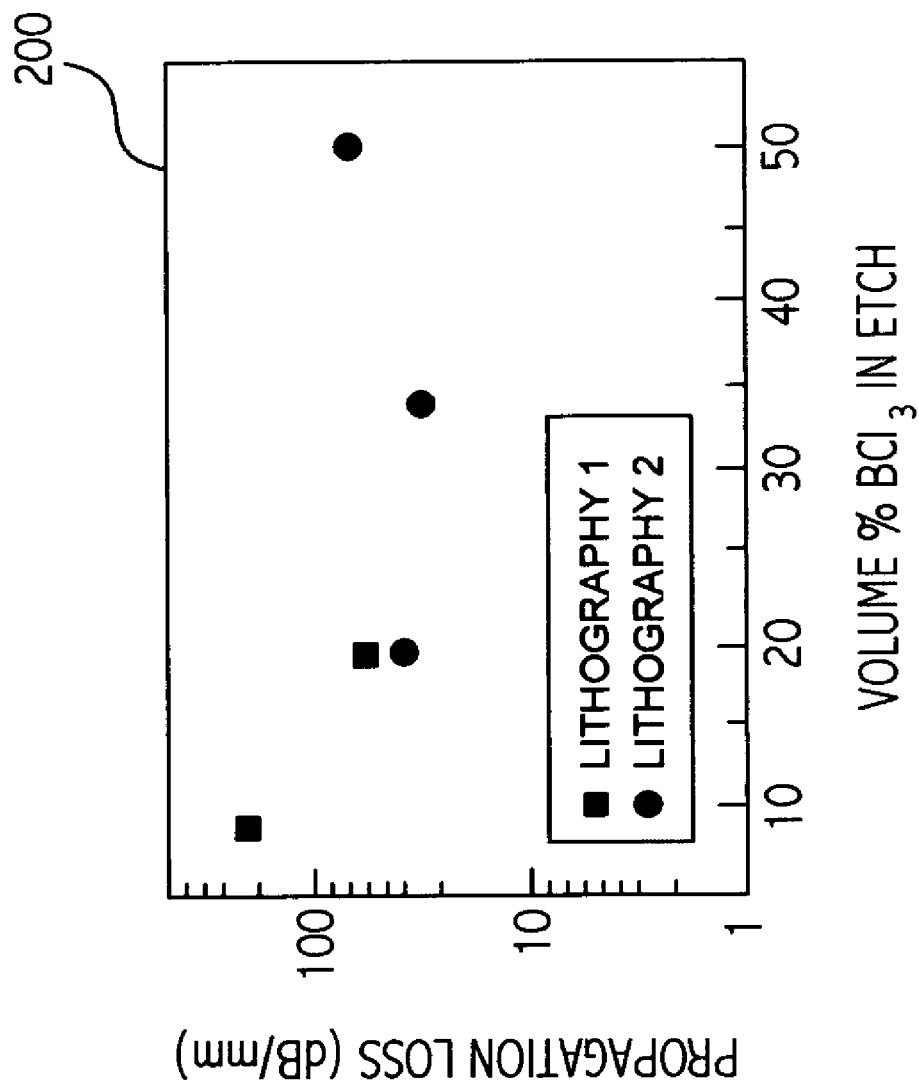
FIG. 2 shows a graph indicating the change in propagation loss versus the percent by volume of $BCl_3$ in the etch in accordance with the invention.

In an embodiment in accordance with the invention, the ratio of $HBr:CH_4:H_2$ is set to about 30:5:5 while $BCl_3$ is typically adjusted to about 33% by volume. Typically, propagation loss is significantly reduced for this embodiment along with the surface roughness of sidewalls 115. From graph 200 in FIG. 2, it is apparent that as the concentration of $BCl_3$ approaches about 33% by volume the propagation loss decreases, as the concentration of $BCl_3$ exceeds about 33% by volume the propagation loss increases as a consequence of increased surface roughness of sidewalls 115.

Figure 3:
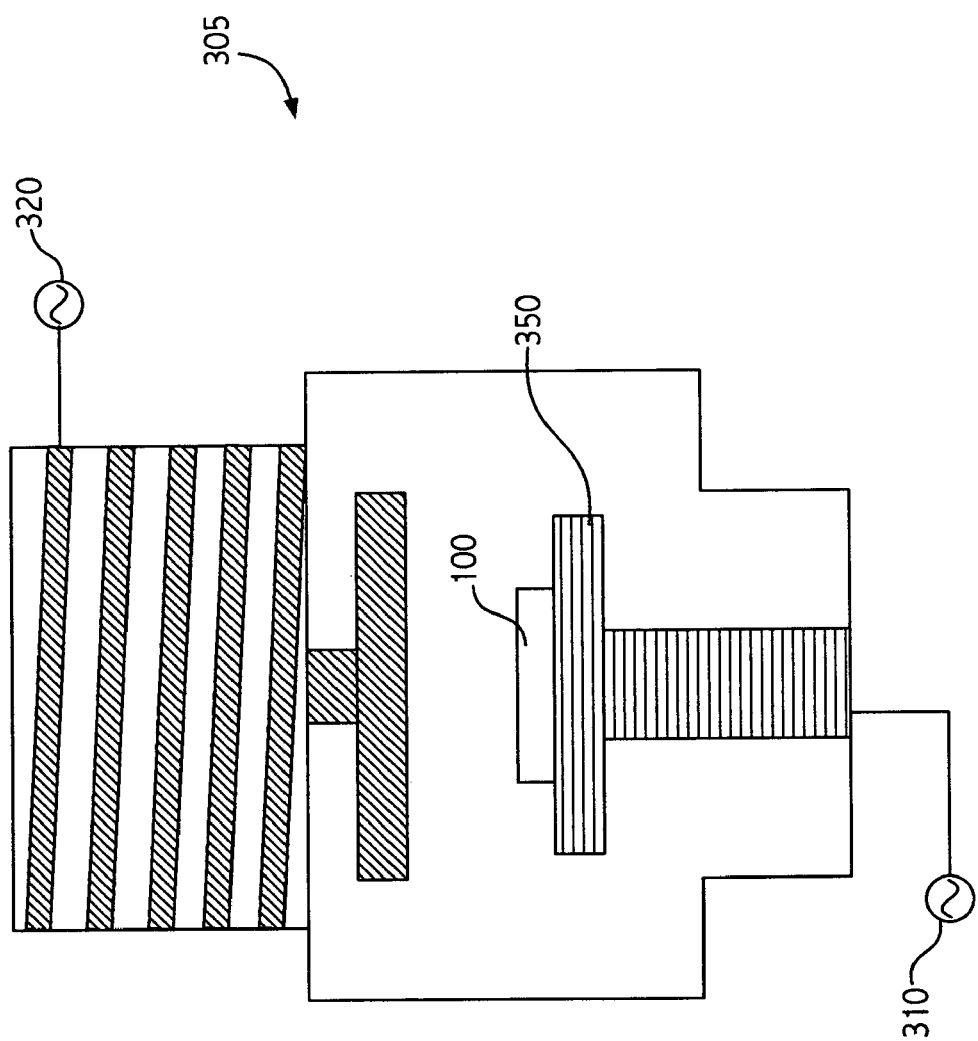
FIG. 3 shows a reactor capable of RIE and ICP mode in accordance with the invention.

With reference to FIG. 3, typical values for reactor 305 in accordance with the invention are having radio frequency (RF) generator 310 typically operating at about 13.56 mHz and in the range 0–200 watts while having RF generator 320 typically operating at about 2 mHz and in the range 50–800 watts with reactor 305 at a pressure typically in the range 2–20 mTorr. Sample 100 is placed on heater 350. For InP based materials the temperature was set to 60° C. although it is expected that the actual temperature may be higher during the etch. The temperature setting is determined by the material being etched and may be higher or lower for the other III-V materials under investigation.

Figure 4B:
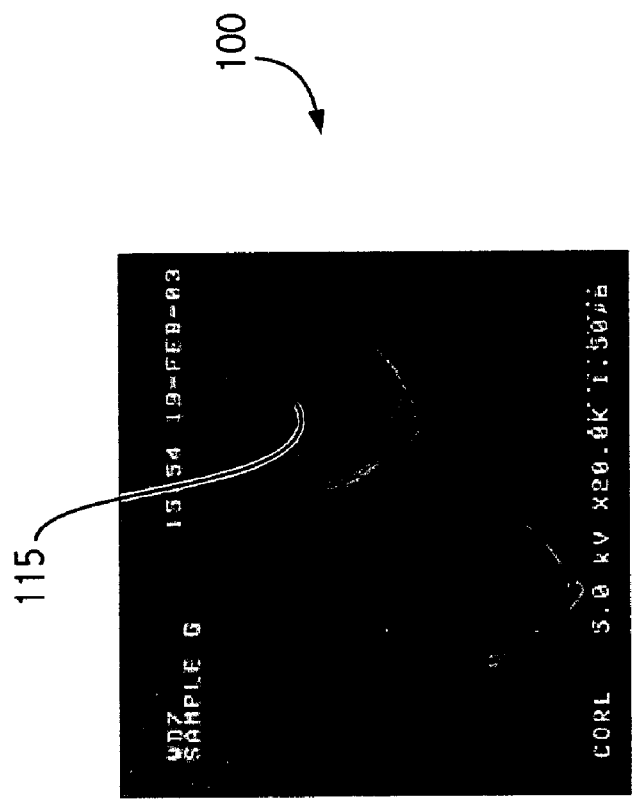
FIGS. 4a–4b show the effect of adding ICP mode in accordance with the invention.
Figure 4A:
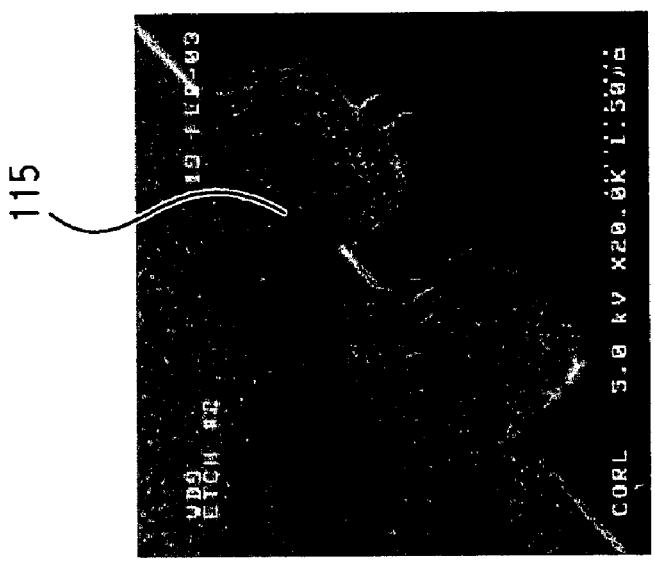

RF generator 320 by providing inductively coupled plasma (ICP) power increases the number of ionized species and enables anisotropic etching with less damage to sidewalls 115 as is apparent from FIGS. 4a and 4b. FIG. 4a shows an electron micrograph of sidewalls 115 using RF generator 310 only resulting in a pure RIE etch. The ratio of $BCl_3:HBr:H_2:CH_4$ is set at 3:32:4:4 and $BCl_3$ is set at 7% by volume. FIG. 4b shows an electron micrograph of significantly smoother sidewalls 115 when using reactor 305 with ICP mode included so that both RF generator 310 and RF generator 320 are in use. The ratio of $BCl_3:HBr:H_2:CH_4$ is set at 3:32:4:4 and $BCl_3$ is set at 7% by volume.

In an embodiment in accordance with the invention, RF 310 is typically set at about 100 watts while RF 320 is typically set at about 400 watts at a typical pressure of about 5 mTorr in reactor 305. However, under these conditions the effective DC bias lies at about 350 volts. For some optical applications, this DC bias value may be too high causing etch damage due to the highly energized incoming ions. The DC bias is typically reduced by reducing RF1 310 to values under 75 watts. Reduction in RF1 reduces the DC bias while preserving the smooth sidewall structure.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

The invention claimed is:

1. A method for etching a III-V based compound comprising:
   creating a mask on said III-V based compound;
   placing said III-V based compound and said mask into a reactor having a pressure between about 2 mTorr to about 20 mTorr;
   introducing a fist gas chosen from HBr, HI, and IBr into said reactor;
   introducing a second gas of $BCl_3$ into said reactor; and
   exposing said III-V based compound to a gas plasma comprising said first and said second gas to etch smooth high aspect ratio sidewalls, wherein $BCl_3$ is present in said reactor at a concentration of about 5 percent to about 75 percent by volume.

2. The method of claim 1 wherein said III-V based compound comprises indium.

3. The method of claim 1 wherein said gas plasma is generated using a reactive ion etching system.

4. The method of claim 1 wherein said III-V based compound is heated to an initial temperature of about 60° C.

5. The method of claim 1 wherein said gas plasma is generated using a combined reactive ion etching and inductively coupled plasma system.

6. The method of claim 5 wherein a first radio frequency generator is operated in the age from about 0 to 200 watts and a second radio frequency generator is operated in the range from about 50–800 watts.

7. A method for etching a III-V based compound comprising:
   creating a mask on said III-V based compound:
   placing said III-V based compound and said mask into a reactor having a pressure between about 2 mTorr to about 20 mTorr;
   introducing a first gas chosen from HBr, HI, and IBr into said reactor;
   introducing second gas of $BCl_3$ into said reactor: and
   exposing said III-V based compound to a gas plasma comprising said first and said second gas to etch smooth high aspect ratio sidewalls, wherein $BCl_3$ is present in said reactor at a concentration of about 5 percent to about 75 percent by volume, said method further comprising introducing $CH_4$ and $H_2$ into said reactor.

8. The method of claim 7 wherein the ratio of said $CH_4$ to said $H_2$ is in the range from 5:100 to 70:30.

9. A method for etching a III-V based compound comprising:
   creating a mask on said III-V based compound;
   placing said III-V based compound and said mask into a reactor having a pressure between about 2 mTorr to about 20 mTorr;
   introducing a first gas chosen from HBr, HI and IBr into said reactor;
   introducing second gas of $BCl_3$ into said reactor;
   introducing a third gas of $CH_4$;
   introducing a fourth gas of $H_2$; and
   exposing said III-V based compound to a gas plasma comprising said first, second third and said fourth gas to etch smooth high aspect ratio sidewalls.

10. The method of claim 9 wherein said III-V based compound comprises indium.

11. The method of claim 9 wherein said gas plasma is generated using a reactive ion etching system.

12. The method of claim 9 wherein the concentration of said first gas is in the range from about 10 percent to about 75 percent by volume.

13. The method of claim 9 wherein said gas plasma is generated using a combined reactive ion etching and inductively coupled plasma system.

14. The method of claim 13 wherein a first radio frequency generator is operated in the range from about 0 to 200 watts and a second radio frequency generator is operated in the range from about 50–800 watts.

15. A method for etching a III-V based compound comprising:
   creating a mask on said III-V based compound;
   placing said III-V based compound and said mask into a reactor having a pressure between about 2 mTorr to about 20 mTorr;
   introducing a first gas chosen from group VII gaseous species into said reactor;
   introducing second gas of $BCl_3$ into said reactor; and
   exposing said III-V based compound to a gas plasma comprising said first and said second gas to etch smooth high aspect ratio sidewalls, wherein $BCl_3$ is present in said reactor at a concentration of about 5 percent to about 75 percent by volume.

16. A method for etching a III-V based compound comprising:
  creating a mask on said III-V based compound;
  placing said III-V based compound and said mask into a reactor having a pressure between about 2 mTorr to about 20 mTorr;
  introducing a first gas of $BCl_3$ into said reactor;
  introducing a second gas of $CH_4$;
  introducing a third gas of $H_2$ such that the ratio of said third gas to said second gas is less than one; and
  exposing said III-V based compound to a gas plasma comprising said first, second and third gas to etch smooth high aspect ratio sidewalls, wherein the ratio of said second gas to said third gas is about 2:1.

* * * * *